United States Patent [19]

Yamaguchi et al.

[11] Patent Number: 5,136,609
[45] Date of Patent: Aug. 4, 1992

[54] METHOD OF PRODUCING FINELY DIVIDED PARTICLES OR POWDER, VAPOR OR FINE DROPLETS, AND APPARATUS THEREFOR

[75] Inventors: Susumu Yamaguchi; Toshihiko Miki; Hiroyuki Uchida, all of Kitakyushu; Itsuo Onaka, 1-32-21, Higashitoyonaka-cho, Toyonaka-shi, Osaka, all of Japan

[73] Assignees: Nippon Steel Corporation, Tokyo; Itsuo Onaka, Osaka, both of Japan

[21] Appl. No.: 559,271

[22] Filed: Jul. 27, 1990

[30] Foreign Application Priority Data

Jul. 29, 1989 [JP] Japan .................................. 1-197417

[51] Int. Cl.5 ............................................ H05B 7/00
[52] U.S. Cl. ......................................... 373/18; 373/20; 373/22; 373/10; 373/13; 373/14; 392/386; 392/387; 392/388; 392/389; 118/724; 118/727
[58] Field of Search ....................... 373/18, 20, 22, 10, 373/13, 14, 11, 15; 219/390, 405, 411; 392/386, 387, 388, 389; 118/726, 727, 730, 725, 724

[56] References Cited

U.S. PATENT DOCUMENTS

| | | | |
|---|---|---|---|
| 2,754,225 | 7/1956 | Gfeller | 373/18 |
| 3,286,012 | 11/1966 | Foex | 373/20 |
| 3,409,529 | 11/1968 | Chopra et al. | 373/18 |
| 3,437,734 | 4/1969 | Roman et al. | 373/14 |
| 3,504,094 | 3/1970 | Hunt et al. | 373/11 |
| 3,970,290 | 7/1976 | Santen et al. | 373/18 |
| 4,484,943 | 11/1984 | Miura et al. | 118/726 |
| 4,654,226 | 3/1987 | Jackson et al. | 118/620 |
| 4,912,296 | 3/1990 | Schlienger | 373/20 |

*Primary Examiner*—Bruce A. Reynolds
*Assistant Examiner*—Tu Hoang
*Attorney, Agent, or Firm*—Wenderoth, Lind & Ponack

[57] ABSTRACT

A method of producing finely divided particles or powder, vapor or fine droplets comprises the steps of heating and melting the starting raw material in a vessel having opposed reflecting surfaces, and ejecting the melted raw material from the vessel as heated finely divided particles or powder, vapor or fine droplets, by introducing a carrier gas into the vessel.

20 Claims, 5 Drawing Sheets

METHOD OF PRODUCING FINELY DIVIDED PARTICLES OR POWDER, VAPOR OR FINE DROPLETS, AND APPARATUS THEREFOR

BACKGROUND OF THE INVENTION

1. Field of the Invention

The present invention relates to a method of producing finely divided particles or powder, vapour or fine droplets and an apparatus therefor, and to a method for utilizing the products, and more particularly, relates to a method of producing finely divided particles or powder, vapour or fine droplets, and an apparatus therefor, and a method of producing products suitable for depositing or coating various metals, metal compounds, and ceramics, etc., on a surface of a base such as a steel sheet as used in a plating, flame spraying, CVD, PVD or spray formation process etc.

2. Description of the Related Art

As a method of producing such finely divided particles or powder, a method in which a metal such as iron or nickel is melted at a high temperature arc discharging portion in a hydrogen or nitrogen gas atmosphere and the molten metal is vapourized by the arc heating to deposit same on a wall surface, or a method in which vapour vapourized from the surface of a high temperature molten product by a high frequency melting process, are well known.

Further, a method disclosed in GB patent No. 1369585, in which oxidized finely divided particles are produced by heating the interior of a rotating hollow cylinder is also well known.

Nevertheless, none of these methods can realize a mass production of the divided finely particles or powder and a continuous use thereof as in the case of a continuous plating for forming a stacked coating layer on a steel sheet, etc.

Particularly, the GB Patent 1369585 discloses only a method of producing oxidized finely divided particles, i.e., an oxide and does not disclose a method of producing a non-oxide or nitride, etc.

Finely divided particles or powder, etc., are used to improve corrosion resistance wear-resistance (hard-wearing) and a surface coloring, etc., by depositing or coating the products on a surface of a steel sheet, etc.

Where a product is deposited or coated on a base such as steel sheet, the manner of depositing coating or stacking an oxide thereon is important, and a non-oxide such as zinc, aluminum, or tin, etc., is generally deposited or coated on a surface of a base material using the oxide as a protecting film. This is because oxidation of a base material can be prevented by coating a protecting film which is more easily oxidized than the base material, at a non-oxidization state so that the protecting film is oxidized. This technology is known as a sacrifice corrosion resistance process.

Furthermore, by depositing, coating or coating-stacking a nitride such as TiN on the surface of the base material, the coloring property or the wear-resistance property thereof can be improved.

The current coating process has the following problems:

(1) In a conventional immersion plating process i.e., a senzimir process. The plating rate has a limit of 200 m/min due to the speed neck of a gas-wiping process for controlling the plating deposit.

(2) In a flame spraying process, the obtained coating layer is porous.

(3) In a CVD or PVD process the cost is increased as the coating thickness becomes larger.

SUMMARY OF THE INVENTION

An object of the present invention is to solve the above-mentioned problems and provide a method of producing finely divided particles or powder, vapour or fine droplets in which the finely divided particles etc., can be continuously mass-produced.

Another object of the present invention 3 to provide an apparatus for carrying out the above-mentioned method.

A further object of the present invention is to provide a method of utilizing the above-mentioned method.

According to the present invention there is provided a method of producing finely divided particles or powder, vapour or fine droplets comprising the steps of: heating and melting a starting raw material in a vessel having opposed reflective surfaces, and ejecting said melted raw material from said vessel as finely divided particles or powder, vapour or fine droplets by introducing a carrier gas into said vessel.

The reason why the vessel has opposed reflecting surfaces is that the radiation energy emitted from the heated melt in a high temperature vessel is reflected at the opposed surfaces, whereby the heat energy loss is lowered.

As the vessel having opposed reflecting surfaces a cylindrical body, polygonal column polyhedron or parallel planes can be used. A vessel that can be used while rotating is preferable.

Particularly, as a cylindrical body, a crucible is preferably used.

The parallel planes are used where for example, titanium having a high melting point, is melted by an electron beam irradiation and a vapourized substance is directly obtained from a solid material.

In this case the material to be vapourized is formed in a plate-shape and the plate-shaped material can be used as an opposing heat reflecting plate.

Preferably, a refractory or a heat resisting ceramics is used as the internal wall surface of the vessel.

To produce a large amount of finely divided particles powder, vapour or fine droplets, preferably a gas is blown into the melted raw material.

As stating raw material to be method, zinc, aluminum, alloys thereof, tin or titanium, etc., can be used.

As the heating process a high temperature combustion gas, plasma or arc is preferably used, and an electron beam or laser can be also used.

To obtain a non oxide or nitride, a non-oxidizing gas such as argon, nitrogen, etc., or a reducing gas such as nitrogen, carbon monoxide, etc., is used, and the entire apparatus or a part of the apparatus is arranged under such an atmosphere, and the injected finely divided particles or powder, vapour or fine droplets are cooled in the non-oxidizing or reducing atmosphere. Preferably, the carrying gas is supplied at a rate of 10 m/sec or less.

According to the present invention, there is provided an apparatus for producing finely divided particles or powder, vapour or fine droplets, comprising a vessel having an opening at both end portions thereof and having opposed reflective surfaces; a raw material supply means by which a starting raw material is supplied into the vessel; a heating means by which the starting raw material supplied therein is heated and melted; an injection means by which a gas is introduced into the vessel from one of the openings, and the melted raw material is fed out of the other opening.

In the present invention the cylindrical crucible is preferably provided at an end of the rotating cylindrical body, and the raw material supply means is preferably formed by a chute or pipe extending through the inside of the rotating cylindrical body to the cylindrical crucible.

A liquid starting raw material is preferably supplied through the chute or pipe, because changes in the amount of the products can be thus minimized. When it is not necessary to consider changes in the amount of the products, a solid starting raw material can be supplied.

In the present invention, a bubbling gas supply means is preferably provided in the vessel, to ensure that a large amount of products is obtained.

Further, according to the present invention there is provided a method of depositing, coating, or coating-stacking the finely divided particles or powder, vapour or fine droplets ejected from the above-mentioned vessel according to the present invention.

In a deposition, or coating method of the present invention, by depositing or coating finely divided particles or powder, vapour or fine droplets on a surface of a base, as a mixture thereof or as finely divided particle alone, the corrosion resistance and the hardwearing properties can be improved, or a surface coloring can be carried out.

A non oxidized deposit can be obtained where an apparatus having opposed parallel planes is used or where a rotating cylindrical body is used, by cooling the injected finely divided particles or powder, vapour or fine droplets in a non oxidizing atmosphere such as argon, nitrogen, etc., or in a reducing gas such as hydrogen, etc., and depositing same on a surface of a base.

Thus, an improved hardwearing property magnetic property can be obtained due to solidified deposits.

Further, by using a plurality of apparatuses having different compositions as a starting material, deposits can be deposited or coated as a plurality of layers or multi-layer. For example, as a first layer on a steel sheet, a material having an improved adhesion property thereto is coated, and as a second layer deposited on the first layer, a material having an improved corrosion resistance and hardwearing property can be coated.

DESCRIPTION OF THE PREFERRED EMBODIMENTS

Examples of the present invention will now be explained with reference to the drawings.

Figure 1:
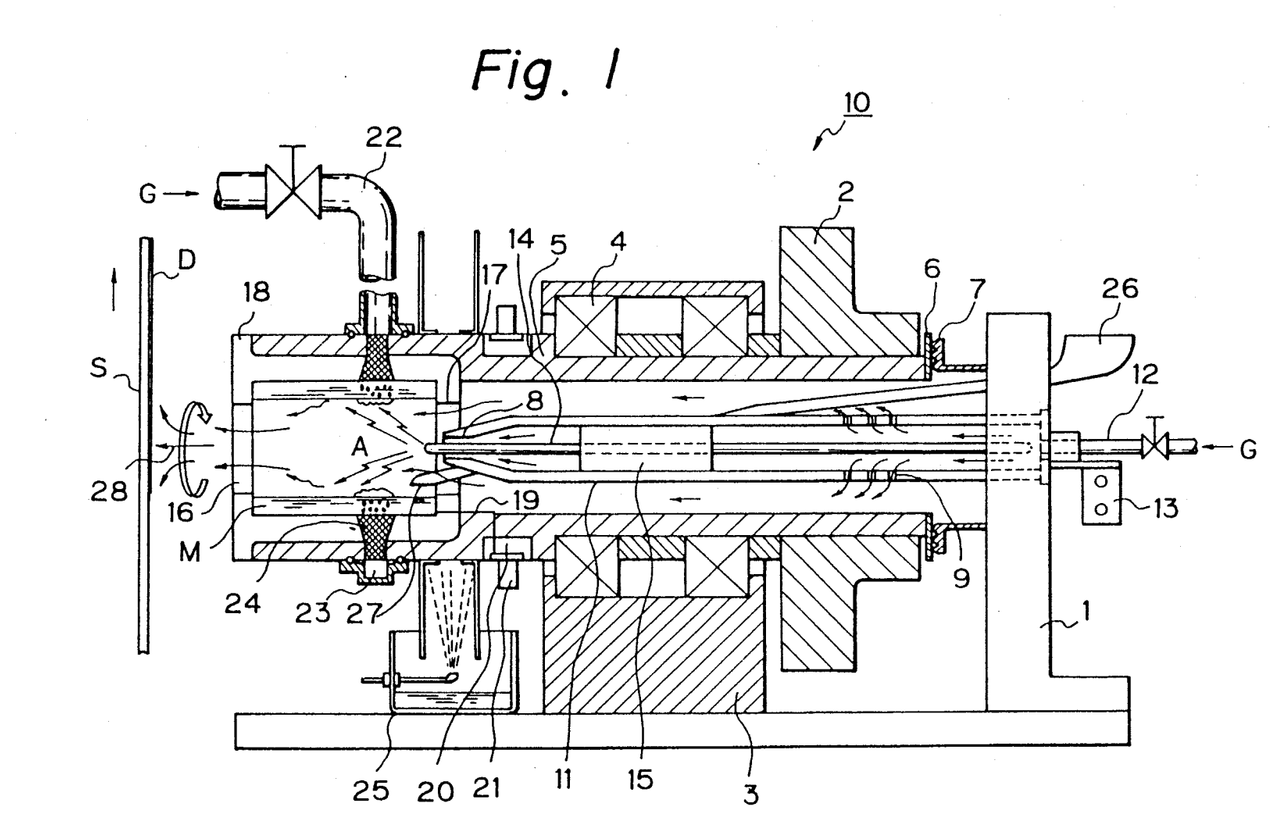
FIG. 1 shows a schematic cross-sectional explanatory view of an example of the present invention in which finely divided particles or powder, etc., produced by the present method are coating-stacked on a base material such as a steel sheet by using an apparatus for producing finely divided particles, etc., of the present invention.

FIG. 1 shows an example according to the present invention in which finely divided particles or powder are obtained and the obtained finely divided particles or powder are deposited, coated or coating-stacked on a base material (steel plate S).

As shown in FIG. 1, a finely divided particle production apparatus 10 is supported by a support frame 1 and is provided with a pulley 2 which is rotated and driven by a not-shown motor, and has a rotating cylindrical body 5 which is rotated through a bearing 4 provided on a stand 3 arranged on the support frame 1. A rotating seal 6 is provided at a side edge portion of the rotating cylindrical body 5. The seal 6 maintains a perfect sealing state together with a rotating seal 7.

In the rotating cylindrical body 5, an insulating pipe 11 consisting of a heat-resisting ceramics and having a top-end narrowed gas blow-out (ejection) opening 8 and the side gas blow-out openings 9, is fixed to the support frame 1.

An inactive gas supply pipe 12 for supplying argon (Ar) or nitrogen ($N_2$), etc., is connected to the other end of the insulating pipe 11 at the support frame side.

The supplied inactive gas G cools the internal portion of the rotating cylindrical body 5, and the insulating pipe 11, and at the same time, acts as a carrier gas to carry vaporized products, as explained hereinafter.

Further, in the internal portion of the insulating pipe 11, an electrode 14 of tungsten (W) etc. connected through a not-shown direct current source and a terminal 13 is fixedly held by an electrode support 15, in such a manner that a gap forming a gas passage is formed between the electrode 14 and the insulating pipe 11.

A cylindrical crucible 18 having openings 16 and 17 at both ends thereof is provided at the end of the rotating cylindrical body 5. The cylindrical internal surface of the crucible 18 always acts as opposed reflective surfaces for reflecting heat energy. Various ceramics can be used as the crucible 18. For an active and high melting point material such as titanium, etc., preferably a water cooling copper hearth is used.

A grounding electrode 19 has a structure in which an arc A is generated from the electrode 14 onto the molten raw material M in the crucible 18, and is set by providing an insulator 20 between the rotating cylindrical body 5 and the insulator 20. The grounding electrode 19 can be moved in accordance with the rotation of the rotating cylindrical body 5.

Further, a bubbling gas introduction portion 24 is provided at both the upper and lower side surfaces of the crucible 18, to accelerate the vapourization of the raw material such as zinc or aluminum, etc. The bubbling gas introduction portion 24 is provided at the outer wall of the rotating cylindrical body 5 and is communicated with a jacket 23 connected to a gas introduction pipe 22 communicated with a not-shown gas source. The bubbling gas introduction portion 24 consists of a heat resisting insulating porous plug led to the rotating cylindrical body 5 and the internal wall of the crucible 18, and introduces a bubbling gas G onto the melt M in the crucible 18.

A cooling system 25 cools the crucible 18, which is heated to a hot temperature, to prevent the effect of heat on rotating drive portions and other apparatuses.

A raw material such as zinc or aluminum, etc., is supplied from a chute or pipe 27 opened at an edge portion of the crucible 18 to the crucible, through a raw material introduction portion 26 and a space between an outer surface of an insulating pipe 11 and the rotating cylindrical body 5. The control of the supply amount of the raw material can be carried out by using a liquid level sensor provided under the chute or pipe 27.

A continuously moving steel sheet S, which is to be treated, faces the outer opening 16 of the crucible 18, and finely divided particles or powder, etc., are caught by a continuously arranged cooling collector device at the opening 18.

The above-mentioned apparatus 10 can be also operated under a reduced pressure by setting the entire apparatus in a reduced-pressure atmosphere.

A bias is applied to the electrode 14 to generate an arc A between the electrode 14 and the molten raw material M. The electric current flows to the molten material through a slip ring 21. The raw material M is melted by the arc and is held in the rotating crucible 18 by centrifugal force.

Even if an uniform arc is not generated, the molten raw material M is uniformly heated at the surface of the internal wall of the crucible 18 and the heated raw material is vapourized from the surface of the material. The vapour is ejected from an ejection opening, by a carrier gas such as Ar or $N_2$, etc., supplied from the gas supply opening arranged at an edge of the rotating cylindrical body 5. In this example, when a gas for bubbling such as argon, etc., is supplied as bubbles into the raw material through a bubbling nozzle, finely divided particles or powder or fine droplets 28 are efficiently ejected together with the bubbles and the vapour, and the ejected products are deposited or coated on a surface of a base plates, such as a steel sheet, moving upward.

By using this apparatus, finely divided zinc particles are produced and directly deposited on the base plate S as a deposit D.

The working conditions were as follows.
Inner diameter of the rotating crucible: 30 mm
Length thereof: 40 mm
Number of revolutions: 400 rpm
Arc voltage: 50 volt
Arc current: 20 A
Amount of carrier gas supplied: 100 Ncm²/min This apparatus was set in an nitrogen gas atmosphere including 10% hydrogen, and finely divided sphere particles or powder having an average diameter of 1 μm were obtained at a production rate of 500 g/hour by ejecting finely divided zinc particles vapour or steam, or fine droplets. According to the chemical analysis of the finely divided particles or powder, the surface thereof was covered with a 50 angstrom (5 nm)-thick layer of zinc oxide. Nevertheless, the zinc oxide was not found in the internal portion of the finely divided particles or powder. It can be considered that the zinc oxide was formed by oxidizing the zinc from the time of taking the zinc product from the apparatus to the time of the analysis.

In an example using an aluminum to be treated aluminum particles or powder having an average diameter of 1 μm were produced at a production rate of 350 g/hour, and only the surfaces of the aluminum particles or powder were oxidized, to a thickness of 60 angstroms (6 nm), as explained above.

In the above-mentioned example using zinc, after the raw material was completely melted and an argon gas bubbling was carried out in the melt layer, the production rate was 4800 g/hour.

On the other hand, in the case of aluminum, the production rate was 3700 g/hour. Thus the production rate where the bubbly process was carried out was about ten times that where it was not carried out.

Further, the ran material zinc was displaced to the raw material aluminum for a short time, because the apparatus has a crucible for melting.

Figure 2:
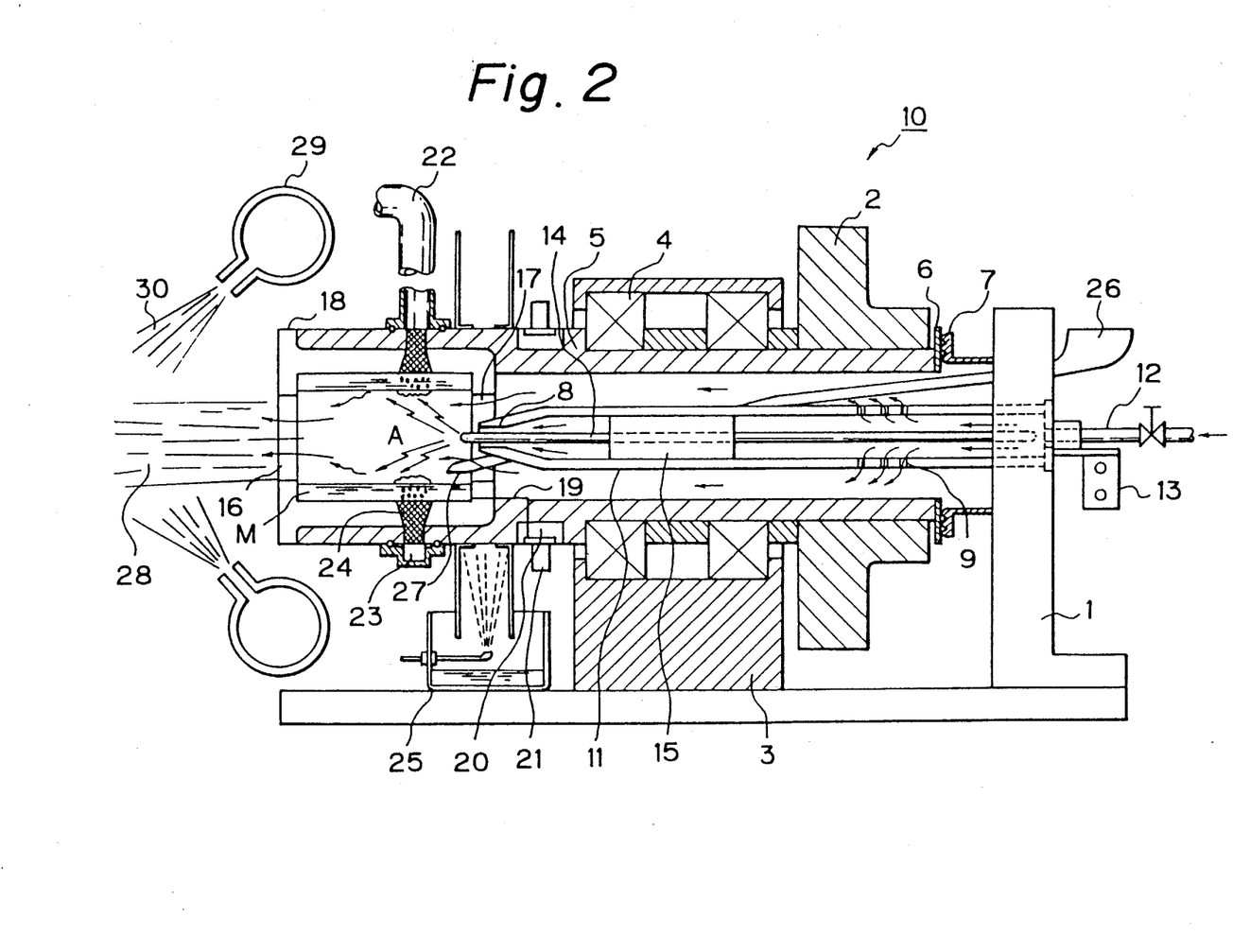
FIGS. 2 and 3 show schematic cross-sectional explanatory views of examples of methods of producing finely divided particles or powder, etc., according to the present invention.
Figure 3:
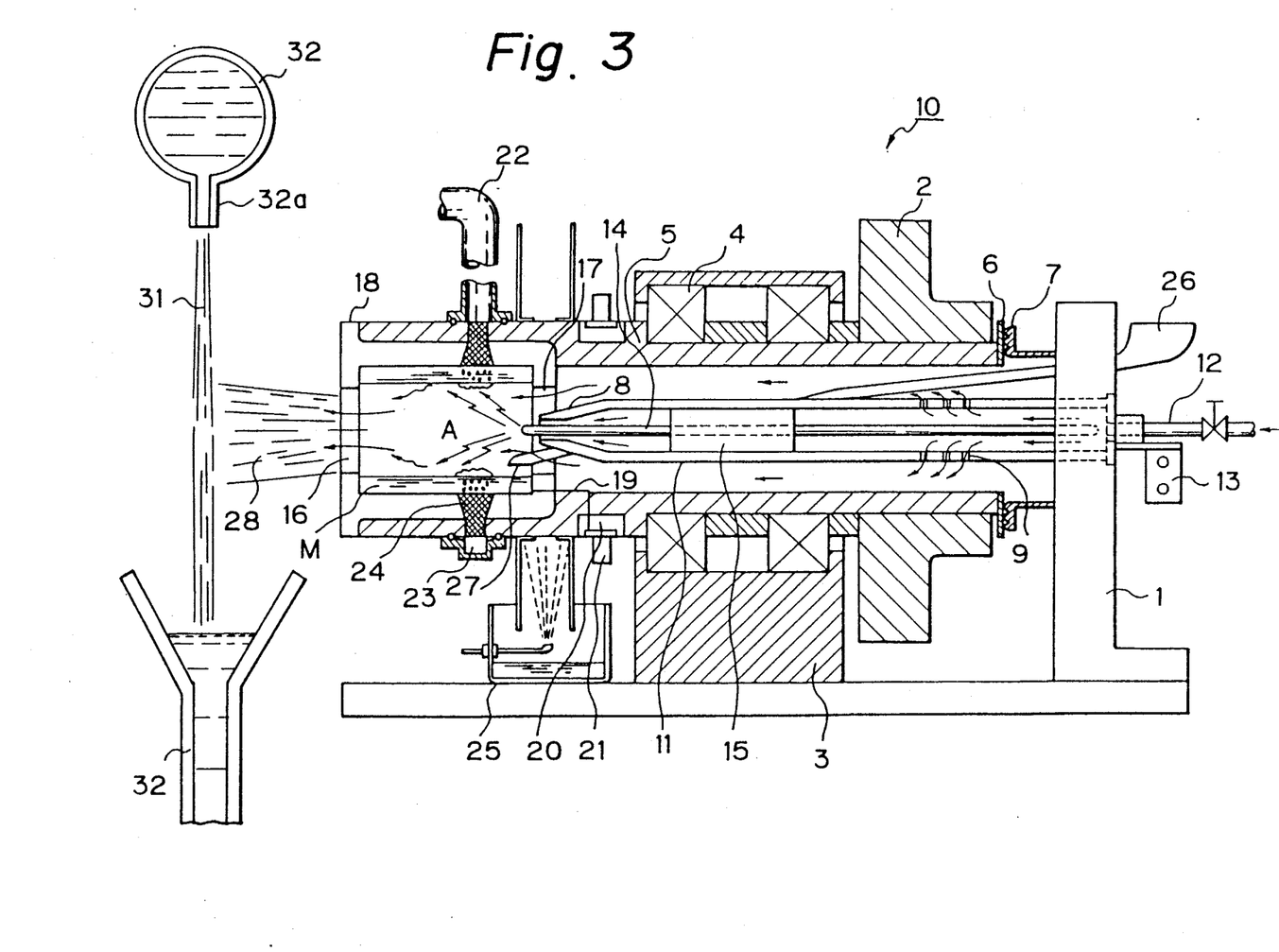

When obtaining non-oxide finely divided particles or powder. The hard wearing and magnetic properties, etc., of the obtained finely divided particles and powder were enhanced by increasing the cooling rate thereof. As methods of increasing the cooling rate, a cooling methods wherein a gas pipe 29 surrounding an opening 16 of the apparatus is provided at the discharging side thereof, and the products of finely divided particles or powder, vapour or fine droplets 28 are cooled by a cooling gas 30 such as nitrogen, etc., from the entire circumferential direction, is shown in FIG. 2, or a method in which the mixture 28 of the products of the finely divided particles or powder, vapour or fine droplets is ejected into water 31 is shown in FIG. 3. In the latter method, water is injected from an injection nozzle 32a of the water pipe 32 and traps finely divided particles or powder, vapour or fine droplets; and falls to a collecting unit 32.

The trapped particles, etc., are separated into water and particles, etc., in a cyclone precipitation tank, etc.

Another example of an apparatus having opposed or facing reflectors will be explained.

Figure 4:
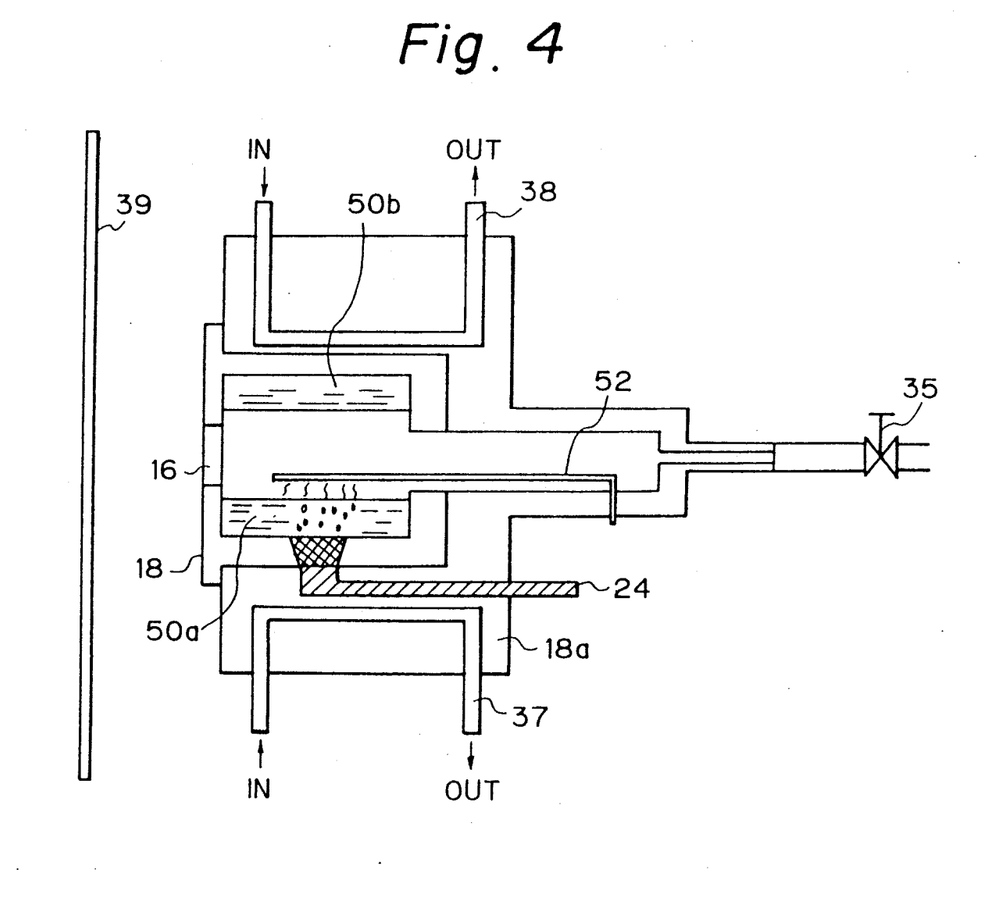
FIG. 4 shows a cross-sectional view of an apparatus provided with a crucible for a melt having two opposed reflecting planes, according to the present invention.

FIG. 4 shows a cross-sectional view of an apparatus providing a crucible for a melt having a two opposed reflecting surfaces.

To the melt 50a and 50b is set a solid of 0.2% aluminum containing zinc. Reference numerals 18 and 18a denote a crucible, and a vessel which supports the crucible, 26 denotes a pipe for gas bubbling, 52 denotes an arc electrode provided near the zinc 50a, 35 denotes a valve by which the supply amount of the carrier gas is controlled, and 37 and 38 denote pipes for cooling the crucible. The cooling water is introduced from the side IN and discharged to the side OUT. Further, 39 denotes a steel plate to be coated, 16 denotes a discharge opening for finely divided particles or powder, vapour or fine droplet.

When the upper portion zinc 50b is melted, it is dropped and acts as a reflecting surface for a radiation energy of the lower portion zinc 50a, and since the arc electrode 52 is provided near to the lower zinc melt 50a, almost all of the arc is emitted onto the side of the lower zinc 50a. A part of the arc is emitted to the side of the upper zinc, and thus the material of the arc electrode must be the same as that of the lower portion material, so that another composition is not mixed with the products. Furthermore, cooling water is applied to an upper cooling pipe 38 to a degree such that the upper zinc 50b is not melted by the radiation energy of the lower portion zinc 50a. The surface temperature of the upper zinc 50b is preferably measured by a not-shown radiation type thermometer or a thermometer embedded in the upper zinc portion 50a.

Since zinc finely divided particles or powder, vapour or fine droplets produced from the lower zinc portion 50b are adhered to the upper zinc 50b, the amount of cooling water supplied to an upper cooling pipe must be controlled so that the amount of adhered particles, etc., is equal to the vapourized amount of the particles, etc., by the radiation energy from the lower portion zinc 50a.

After the lower zinc 50b is completely melted, a non-oxidizing gas or a reducing gas such as argon nitrogen or hydrogen, etc., is supplied from a pipe 24, and the amount of products of finely divided particles, etc., can be increased by bubbling the lower zinc, as explained in the above examples.

The finely divided zinc particles or powder zinc vapour and fine zinc droplets produced by using the arc and gas bubbling are fed or discharged from the opening 16 together with a mixture thereof with the argon, nitrogen or hydrogen gas.

The discharged mixture is deposited or coated on a surface of an upwardly moving steel plate 39.

In this case, when an oxide film (iron oxide) exists on the surface of the steel sheet the adhesion to the mixture becomes poor, and thus the steel sheet 39 must have a high-grade surface obtained by using a continuous annealing furnace using a reducing gas. Further, to prevent an oxidation of the surface of the steel sheet before a deposition of the mixture, all or a part of the apparatus producing the finely divided zinc particles or powder, zinc vapor of fine zinc droplets must be arranged under a non-oxidizing atmosphere or a reducing atmosphere. To maintain the amount of zinc which is deposited on the surface of the steel sheet at a constant value, the arc current must be changed in accordance with a change in the speed of movement of the steel sheet 39. Further, in the lower zinc portion 50a a not shown sensor by which the reduction of the liquid level of zinc can be sensed is provided, and the reduced amount of zinc is supplements through a not-shown chute or pipe. Accordingly, while moving the steel sheet 39 having a width of 600 mm and a thickness of 1.0 mm at a speed of 200 m/min, a 12 μm thick coating of zinc was obtained in a 10% hydrogen containing nitrogen atmosphere having a temperature of 480° C. As a gas for carrying the starting material, a 10% hydrogen containing nitrogen was used at a supply rate of 400 Nm$^3$/hour. The arc voltage was 50 V and the arc current was 2500 A.

Next, a method of producing finely divided oxide particles or powder, etc., using this apparatus, will be explained.

Figure 5:
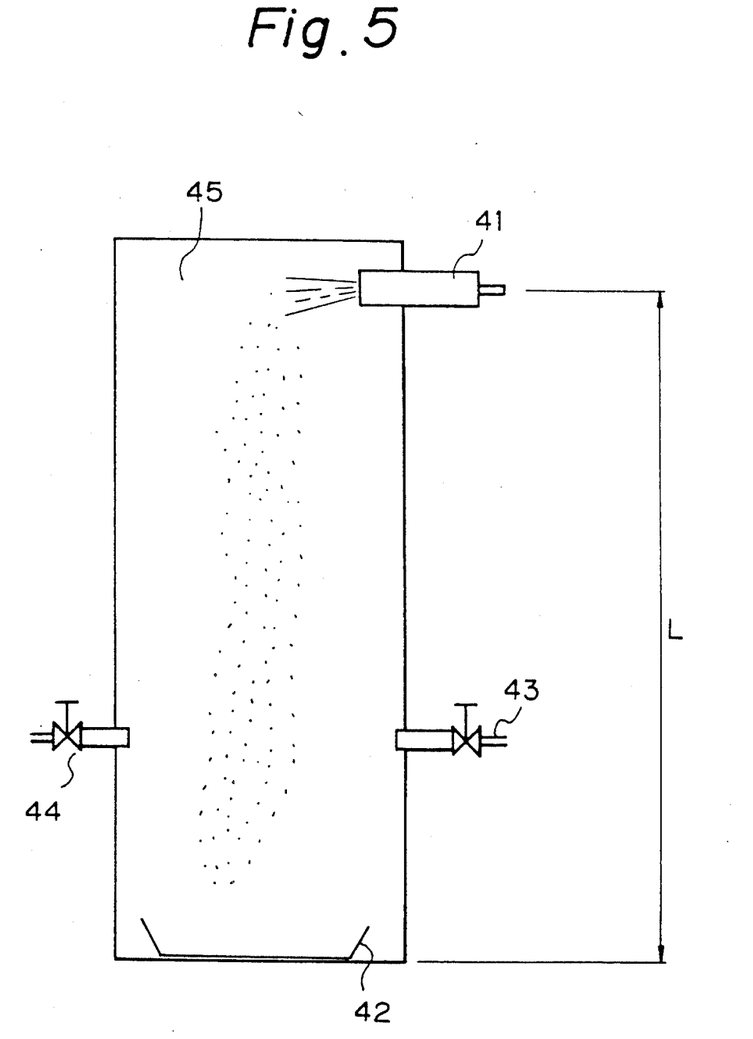
FIG. 5 shows an example of a method of producing finely divided particles, etc., in an atmospheric condition, according to the present invention.

When the finely divided oxide particles or powder, etc. are produced, the valves 43 and 44 are opened. The interior of a chamber 45 is maintained under an atmospheric condition and the injection unit 41 in FIG. 5 is operated. Then, finely divided zinc particles or powder, zinc vapour or fine zinc droplets formed in the apparatus are injected from the opening 16 (FIG. 4) into the atmosphere as shown in FIG. 5. The injected finely divided zinc particles, etc., are then solidified in the atmosphere.

When the diameter of the zinc droplets is large, the distance L between the injection unit 41 and a collection dish 42 is made larger, to ensure a sufficient cooling time.

Also, by using the same apparatus shown in FIG. 1, finely divided zinc oxide particles, etc., were produced while using a 10% hydrogen carrier gas containing nitrogen. The interior of the chamber 45 was maintained under an atmospheric condition. The product was injected into the chamber 45 at an arc voltage of 50 V and arc current of 1200 A, with the result that zinc oxide particles having an average diameter of 1.5 μm were obtained in a collection dish 42. Also, aluminum was used as a starting material for the melting, and aluminum oxide particles having an average diameter of 1.3 μm were obtained.

Where finely divided non-oxide particles or powder are obtained, nitrogen gas, argon gas, hydrogen gas, hydrogen containing nitrogen gas, or hydrogen containing argon gas is introduced into the chamber 45, and oxygen in the atmosphere is discharged therefrom. The injection unit 41 shown in FIG. 5 is operated in the chamber, and finely divided non-oxidized aluminum particles are collected. In this case, by blowing a low temperature gas from the valve 43, the cooling of the injected particles is accelerated.

Then, by using the same apparatus as shown in FIG. 1 finely divided non-oxidized zinc particles or powder were produced. As the carrier gas, a 10% hydrogen containing nitrogen was used and the interior of the chamber 45 was maintained under an atmosphere of 10% hydrogen containing nitrogen. The melted zinc was injected into the chamber 45 at an arc voltage of 50 V and an arc current of 1200 A, and finely divided zinc particles having an average diameter of 1.2 μm were obtained. Also, melted aluminum was used, and finely divided aluminum particles having an average diameter were obtained.

We claim:

1. An apparatus for producing finely divided particles or powder, vapour or fine droplets comprising:
   a vessel having an opening at both end portions thereof and having opposed reflective surfaces,
   a raw material supply means by which a starting raw material is supplied into said vessel,
   a heating means by which said starting raw material supplied into the opposed reflective surfaces of the vessel is heated and melted,
   an injection means by which a gas is introduced into said vessel from one of said openings, and a melted raw material is ejected from said other opening.

2. An apparatus according to claim 1, wherein said vessel having opposed reflecting surfaces is one of a cylindrical body, a polygonal column, a polyhedron and two horizontal planes.

3. An apparatus according to claim 1, wherein said cylindrical body is a crucible.

4. An apparatus according to claim 1, wherein a cylindrical crucible is provided at an end of the rotating cylindrical body and said raw material supply means is formed by a chute or pipe extending through an internal portion of said rotating cylindrical body to said cylindrical crucible.

5. An apparatus according to claim 1, wherein a gas supply means for bubbling is provided in said vessel.

6. An apparatus according to claim 1, wherein said vessel has a means for rotating.

7. An apparatus according to claim 2, wherein said vessel has a means for rotating.

8. An apparatus according to claim 3, wherein said vessel has a means for rotating.

9. A method of depositing, coating or coating-stacking ejected finely divided particles or powder, vapour or fine droplets onto a base material, comprising the steps of:
   heating and melting a starting raw material at opposed reflective surfaces of a vessel,
   producing finely divided particles or powder, vapour or fine droplets from a melted starting raw material, ejecting produced finely divided particles or powder, vapour or fine droplets from the vessel, by introducing a carrier gas of at least one member selected from a group consisting of an non-oxidizing gas and a reducing gas into said vessel, and depositing, coating or coating-stacking ejected finely divided particles or powder, vapour or fine droplets onto the base metal.

10. A method according to claim 9, wherein said base material is a steel plate.

11. A method according to claim 9, wherein a multilayer product with different composition are formed.

12. A method of producing finely divided particles or powder, vapour or fine droplets, comprising the steps of:

heating and melting a starting raw material at opposed reflective surfaces of a vessel, producing finely divided particles or powder, vapour or fine droplets from a melted starting raw material, and ejecting produced finely divided particles or powder, vapour or fine droplets from the vessel, by introducing a carrier gas of at least one member selected from a group consisting of an non-oxidizing gas and a reducing gas into said vessel.

13. A method according to claim 12, wherein said vessel having opposed reflective surfaces is one of a cylindrical body, a polygonal column, a polyhedron and two horizontal planes.

14. A method according to claim 13, wherein said cylindrical body is a crucible.

15. A method according to claim 19, wherein said vessel is rotated.

16. A method according to claim 3, wherein said vessel is rotated.

17. A method according to claim 12, wherein said starting raw material is at least one member selected from a group consisting of zinc, aluminum, tin, titanium and alloys thereof.

18. A method according to claim 12, wherein said starting material is heated by an electrical heating means of at least one member selected from a group consisting of an arc, plasma, electron beam and laser.

19. A method according to claim 12, wherein said vessel is rotated.

20. A method according to claim 12, wherein said melted starting raw material is bubbled in said vessel.

* * * * *